United States Patent [19]

Ogawa

[11] Patent Number: 4,896,049
[45] Date of Patent: Jan. 23, 1990

[54] COLOR IMAGE SENSOR OBTAINED FROM VISUAL PHOTOSENSITIVE MATERIALS DERIVED FROM BIOLOGICAL SUBSTANCES

[75] Inventor: Kazufumi Ogawa, Hirakata, Japan

[73] Assignee: Matsushita Electric Industrial Co., Ltd., Osaka, Japan

[21] Appl. No.: 198,829

[22] Filed: May 26, 1988

[30] Foreign Application Priority Data

May 29, 1987 [JP] Japan .................................. 62-135013

[51] Int. Cl.$^4$ ....................... H01L 27/14; H01L 31/00
[52] U.S. Cl. .................................. 250/578; 250/211 R; 250/226; 357/8; 430/495
[58] Field of Search ................... 250/211 R, 578, 226; 357/8; 430/495

[56] References Cited

U.S. PATENT DOCUMENTS

| 4,577,098 | 3/1986 | Ogawa ................................. 250/578 |
| 4,654,536 | 3/1987 | Saito et al. ........................... 250/578 |
| 4,663,535 | 5/1987 | Nakai et al. .......................... 250/578 |
| 4,804,834 | 2/1989 | Katsura et al. .................. 250/211 R |

Primary Examiner—Edward P. Westin
Attorney, Agent, or Firm—Wenderoth, Lind & Ponack

[57] ABSTRACT

Disclosed is an image sensor improved in its color signal balance and sensitivity, by using visual substances having sensitivity to red, green or blue light obtained by denaturing substances similar to the protein of the human eye which are photosensitive substances extracted from halobacterial, and laminating and forming these substances in a mosaic or stripe form in the photosensor part of a CCD.

2 Claims, 4 Drawing Sheets

COLOR IMAGE SENSOR OBTAINED FROM VISUAL PHOTOSENSITIVE MATERIALS DERIVED FROM BIOLOGICAL SUBSTANCES

BACKGROUND OF THE INVENTION

This invention relates to an image sensor to replace the human eye, and more particularly, to a color image sensor to be used as the eye for a video camera, monitoring camera, robot or the like, capable of obtaining a sharp color image even in indoor light, by improving the color characteristics of a semiconductor solid image pickup device such as a CCD type, an MOS type, a CPD type and a BBD type.

Conventional color image sensors are, generally, color solid image pickup devices having mosaic or stripe shaped color filter arrays positioned and mounted on the photo sensor arrays on the surface of a semiconductor solid image pickup device, being designed to separate the light entering the solid image pickup device picture element part from the color filter into lights corresponding to color elements, and reading out as color signals by the photo-sensor.

However, the spectral transmissivity of these color filters is, for example in the case of a three-color type, as shown in FIG. 1, and the light actually reaching up to the photo-diode in the silicon substrate to be utilized as optical current is only the shaded portion in FIG. 1. That is, in color imaging, the sensitivity is substantially lowered notably as compared with that of a black-and-white image.

Therefore, in order to enhance the optical sensitivity, it is necessary to improve the sensitivity of the silicon photo diode which is a photo-sensor array formed in a silicon substrate, or raise the transfer efficiency or decrease the noise of the transfer unit or drive unit to increase the amplification factor. Furthermore, in order to improve the color balance, it is necessary to adjust the spectral sensitivity characteristic to the visual sensitivity. To improve the transfer efficiency and decrease the noise in the transfer unit or drive unit, however, there has been shortcomings in respect to the existing semiconductor device fabricating process (the fabricating process of solid image pickup device). On the other hand, it has been proposed to reduce the depth of impurity diffusion when a silicon photo diode is produced in order to improve the blue sensitivity which is low in the conventional silicon photo diode, or to laminate a photoconductive film, such as $ZnSe-Zn_{1-x}Cd_xTe$ (Newvicon film) or an amorphous silicon on a semiconductor substrate as a photo-sensor film, instead of a silicon photo diode.

Therefore, as shown in the characteristics in FIG. 2, the relative sensitivity characteristics of a silicon photo diode, a Newvicon film and an amorphous silicon (a-Si) greatly deviates from the visual sensitivity characteristics of the human eye, and such modifications are not satisfactory as a sensor to replace the human eye. That is, in the prior art, it was a maximum achievement to obtain the spectral sensitivity as shown in FIG. 2, and even these achievements are not satisfactory in that said sensitivity characteristics greatly deviate from the visual sensivitity characteristics. For example, in the Si diode, if formed in a small depth, the blue sensitivity (the region between 400 and 480 nm) necessary to obtain color images in the solid image pickup device was limited at 10 to 20%. That is, since the optical current that can be taken out as an actual color signal was very small in the blue region, the total sensitivity was lowered in the whole region. In the Newvicon film or amorphous silicon film, although the blue sensitivity can be improved, the red sensitivity (above 650 nm) is too intense, or the film forming process is complicated because of the presence of inorganic matter, and it is far from practical to use at the present.

SUMMARY OF THE INVENTION

It is, hence, a primary object of this invention to enhance the optical sensitivity and to improve the color balance of a color solid image pickup device, by taking out an optical current similar to the visual sensitivity of the eye, and to improve the total balance of the color signal.

In this invention, as the sensor material, certain visual substances, differing each from the other in the photosensitive wavelengths extracted from a biological body similar to the visual sensitivity of man are used, such as, cell membranes containing bacteriorhodopsin (violet films), and as the photo sensor, instead of the conventional Si photo-diode array, films of said visual substances excellent in optical sensitivity and similar in visual sensitivity in the wavelength regions of red, blue and green are integrally formed in a mosaic or a stripe shape, so that the color signal balance and sensitivity may be improved.

An example of a photosensitivity spectrum of cell membrane (violet film) containing a visual substance film using a biological material, such as bacteriorhodopsin, is very similar to the visual sensitivity curve of man as shown in FIG. 3D. Furthermore, in this violet film, by denaturing retinal in the opsin protein which is the principal component of the membrane substance, the peak of the optical response can be moved, for example, to the red, blue or green region. Therefore, by arranging the violet films sensitive to, for example, said three primaries in a mosaic or stripe shape and integrally forming it with the solid image pickup device, it is possible to adjust in good balance the color signals to the conditions of the vision by the human eye.

It is therefore possible, according to the present invention, to realize a color solid image sensor excellent in color reproducibility.

While the novel features of the invention are set forth in the appened claims, the invention, both as to organization and content, will be better understood and appreciated, along with other objects and features thereof, from the following detailed description taken in conjunction with the drawings.

DETAILED DESCRIPTION OF THE INVENTION

Figure 1:
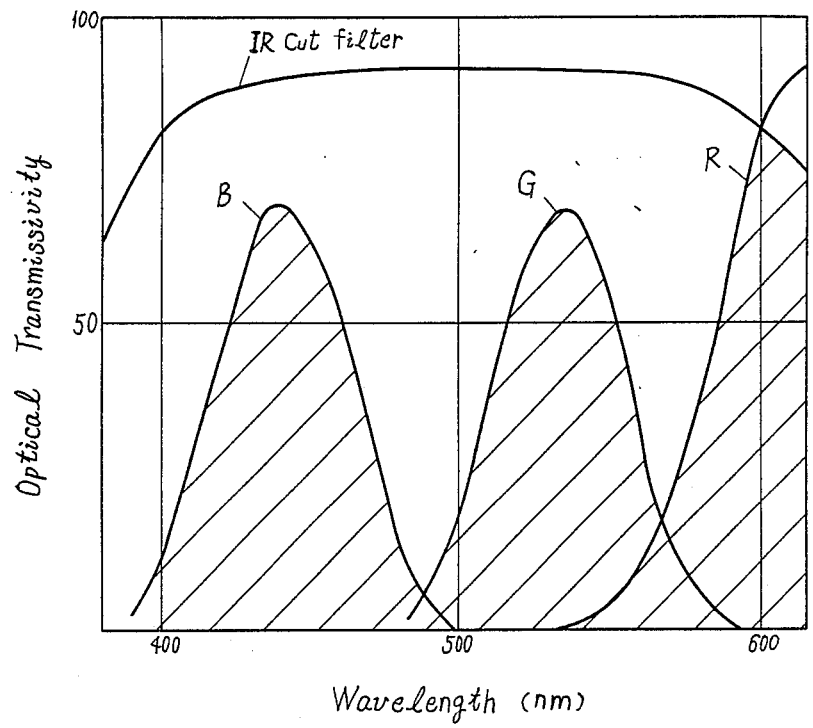
FIG. 1 is a characteristic diagram showing the spectral transmissivity of generally employed R.G.B. type mosaic filter and infrared cut filter.
Figure 2:
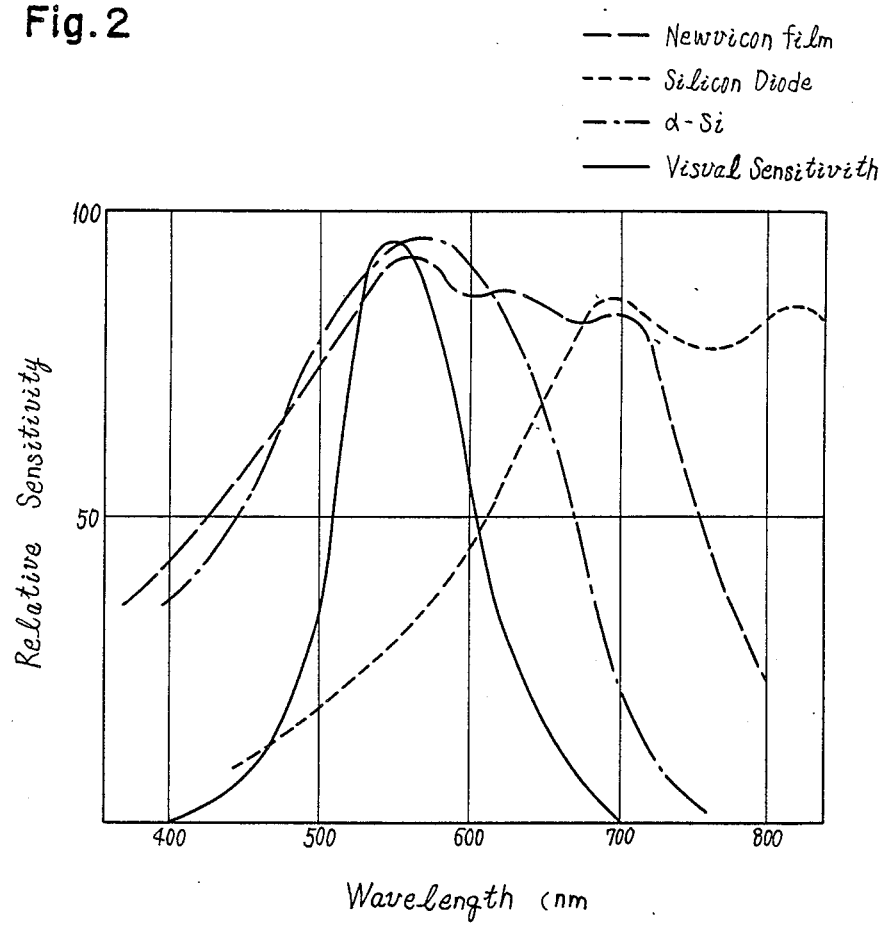
FIG. 2 is a photosensitivity spectrum diagram of silicon photo diodes used in the general solid image pickup device.
Figure 3:
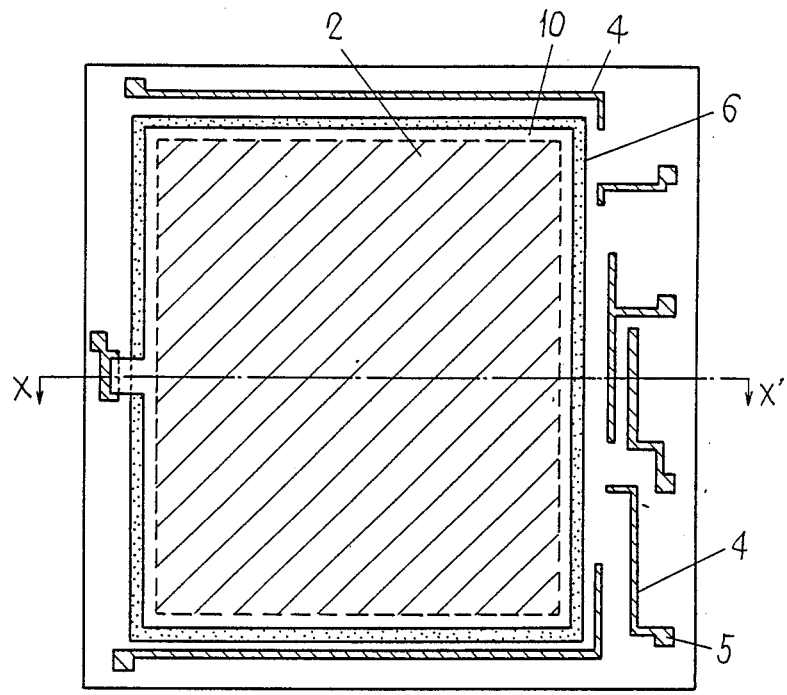
FIG. 3A is a plan view of an image sensor according to one of the embodiments of this invention.
FIG. 3B is a sectional view along line X—X' in FIG. 3A.
FIG. 3C is a magnified sectional view of part A in FIG. 3A.
FIG. 3D is a characteristic diagram showing one photosensitivity spectrum of the violet film used in this invention.
Figure 3:
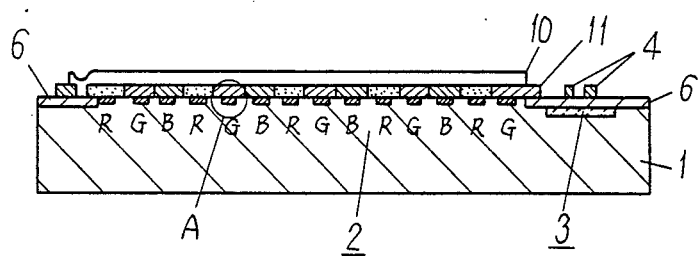
Figure 3:
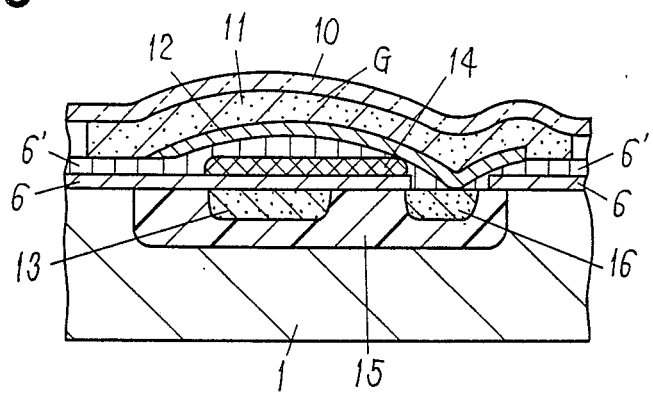
Figure 3:
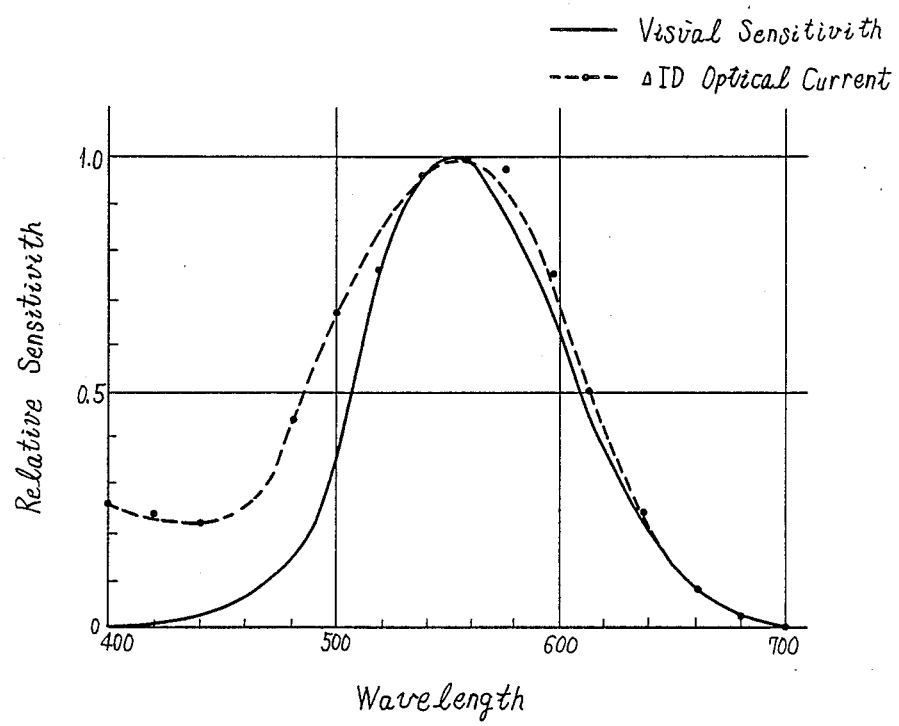

FIG. 3A to FIG. 3C represent an image sensor according to one of the embodiments of this invention, in which numeral 1 denotes an n-type Si semiconductor substrate of the surface (hereinafter called the substrate), 2 is a picture element region, 3 is a drive unit, 4 is a metal wiring, 5 is an electrode, 6, 6' are insulation films, 10 is a transparent electrode, 11 is a mosaic or stripe shaped visual substance film, 12 is a contact electrode, 13 is an n+ diffusion region 14 is a gate electrode, 14 is a p-well diffusion region, and 16 is an n-type diffusion part.

Explaining this sensor in further details, for example as shown in FIGS. 3A to 3C, a picture element region 2 for sensing an optical image is formed in the middle of a surface Si semiconductor substrate (hereinafter called substrate) 1, and this region 2 is composed of, among others, a diffusion part for accumulating an electric charge for storing signal charges based on picture, and a charge coupled device (CCD) as the charge transfer region for transferring said signal charged based on picture as electric signals. Around this picture element region 2 is disposed a drive part 3 composed of shift register, CCD, etc. for driving this region 2. On the whole, a CCD type solid image pickup device is composed. Furthermore, as shown in FIG. 3C, an n-type diffusion part 16 for accumulating said electric charges, and a contact electrode 12 for connecting a visual substance film (to be described later) as the photo sensor corresponding to each picture element are formed.

In addition, several visual substances responding to plural colors (for example, in FIG. 3B, cell membranes (violet films) containing bacteriorhodopsin) are arranged in stripe or mosaic form as a visual substance film 11, which is laminated on the whole surface of picture element region 2 and then a transparent electrode (for example, ITO film) 10 is formed on the entire surface of the picture element region 2. Incidentally, the bacteriorhodopsin may be varied in the sensing wavelength as shown in the table below by, for example, isolating from halophils, and denaturing retinal in the opsin protein.

For example, as the substance sensitive to red color of 593 mn,

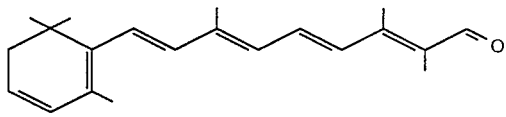

or as the substance sensitive to blue color of 420 nm,

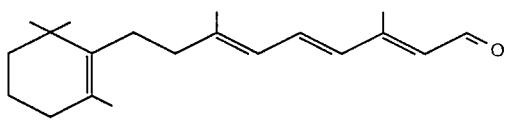

or as the substance sensitive to green color of 530 nm,

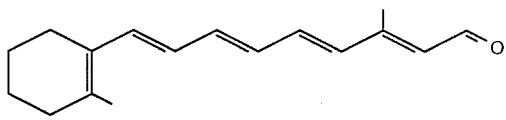

and others may be used, as required, instead of retinal.

TABLE

Synthetic Analogs of Retinal

| Derivative | Absorption peak | Derivative | Absorption peak |
|---|---|---|---|
|  | 467[a] |  | 465[h-i] |
|  | 420[b*] |  | 495[h,i,k-m] |
|  | 497[c] |  | 483[h-i] |
|  | 485[d*] |  | 492[e*] |
|  | 502[e] |  | 465[i,n-p*] |

TABLE-continued
Synthetic Analogs of Retinal

| Derivative | Absorption peak | Derivative | Absorption peak |
|---|---|---|---|
| (structure) | 530[a,b] | (structure) | 593[c,d,e] |
| (structure) | 560[f] | (structure) | [a] |
| (structure) | 476[g] | (structure) | 400[g] |
| (structure) | 325[g] | (structure) | 510[a,b] |
| (structure) | 540[a,h,i] | (structure) | 520[e,h,i] |
| (structure) | 480[i,k] | (structure) | 535[i,k] |
| (structure) | 480[a,b] | (structure) | 535[i,k] |
| (structure) | 525[i] | (structure) | 595[i,k] |
| (structure) | 500[f*] | (structure) | 420[p,q*] |
| (structure) | 485[g] | (structure) | 345[p,q] |

TABLE-continued
Synthetic Analogs of Retinal
| Derivative | Absorption peak | Derivative | Absorption peak |
|---|---|---|---|
| 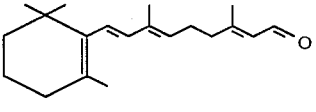 | 315[p,r] | 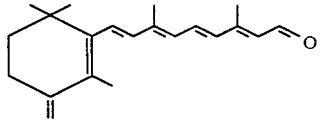 | 470[w] |
| | 315[p,r] | | 467[x,y] |
| | 517[s,t] | | 465[x] |
| | 500[u] | | 411[x] |
| | 527[u] | | 490[aa] |
| | 465[v*] | | 485[i*] |
| | 520[v] | | 485[v*] |
| | 460[bb*] | | 489[dd] |
| | 410[cc*] | | 488[dd] |
| | 490[dd] | | 483[dd] |
| 9-cis retinal | 485[ee] | 7,9-dicis retinal | 460[hh] |
| 9,13-dicis retinal | 481[ff] | 7,9,13-dicis retinal | 455[gg] |
| 7-cis retinal | 450[gg] | | |

Incidentally, in FIGS. 3A, 3B, a wiring 4 is a metal wiring for connecting between drive parts, and an electrode 5 is a pad for connecting to an external lead.

FIG. 3C shows a magnified sectional view of one picture element portion (A in FIG. 3B) of a CCD type solid image pickup device, in which the signal charge photoelectrically converted by the visual substance film 11 as a photo sensor is accumulated in the diffusion part 16, and a signal charge is transferred to the n+ diffusion region 13 from the diffusion part 16, using numeral 6 as the gate insulation film, by means of a MOS transistor gated by the polysilicon gate electrode 14.

Meanwhile, when using plural types of violet film 11 as photosensor films, it is possible to easily form thin films in a pattern as the visual substance film by the Langmuir-Blodgett method, by electrodeposition, or by the lift-off method, which is a kind of photolithography.

In the above embodiment, the visual substance is connected to the source electrode of the two-dimensional CCD solid image pickup device, but, needless to say, similar effects will be obtained when the visual substance is connected to the gate electrode. It is also obvious that it can be applied to one-dimensional sensor, too. Furthermore, as the visual substance in this invention, rhodopsin or the like extracted from organisms other than halophils can be used by stabilizing.

Thus, by using plural cell membranes (violet films) containing, for example, bacteriorhodopsin as the photo sensor of solid image pickup device, a highly sensitive color image sensor having a spectral sensitivity similar to the visual sensitivity of the human eye may be realized as shown in FIG. 3D. Besides, without using the IR cut filter which was necessary conventionally, a color image sensor of an excellent color balance can be realized.

While specific embodiments of the invention have been illustrated and described herein, it is realized that other modifications and changes will occur to those skilled in the art. It is therefore to be understood that the appended claims are intended to cover all modifications and changes which fall within the true spirit and scope of the invention.

We claim:

1. An image sensor having a plurality of visual substance films composed of biological substances producing optical current or optically induced electric power, depending on the intensity of light by responding to light of a specific wavelength, said usual substance films arranged in mosaic or stripe form on a picture element region containing a charge accumulation region of a solid image pickup device and a charge transfer region, being formed between a contact electrode and a transparent electrode which are connected to said charge accumulation region, and wherein said plurality of visual substance films are violet films of varied sensory wavelength produced by isolating bacteriorhodopsin from halophils and denaturing retinal in an opsin protein thereof.

2. An image sensor according to claim 1, wherein said visual substances are violet films responding to red, green and blue light.

* * * * *